US007161393B1

(12) United States Patent
Potanin et al.

(10) Patent No.: US 7,161,393 B1
(45) Date of Patent: Jan. 9, 2007

(54) CURRENT REGULATION CIRCUIT

(75) Inventors: Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 244 days.

(21) Appl. No.: 10/860,447

(22) Filed: Jun. 3, 2004

(51) Int. Cl.
*H03B 1/00* (2006.01)

(52) U.S. Cl. ........................ 327/108; 327/427; 361/79; 361/86; 361/92

(58) Field of Classification Search ........ 323/312–315, 323/274, 280, 273, 316; 327/538–540, 434, 327/309, 108, 427; 307/300, 296.2; 361/78, 361/79, 86, 92, 64–65
See application file for complete search history.

(56) References Cited

U.S. PATENT DOCUMENTS 5,696,435 A * 12/1997 Koenck ...................... 320/145
5,796,278 A * 8/1998 Osborn et al. ............. 327/108
6,233,128 B1 * 5/2001 Spencer et al. ............... 361/86

OTHER PUBLICATIONS

Linear Technology Corporation. Nd. "150mA Standalone Linear Li-Ion Battery Charger in ThinSOT." 16pp.

* cited by examiner

*Primary Examiner*—Rajnikant B. Patel
(74) *Attorney, Agent, or Firm*—Darby & Darby PC; John W. Branch

(57) ABSTRACT

A method and circuit for providing a regulated current to a load stabilized with respect to the load current, a load voltage, and a circuit temperature. The circuit includes a power pass device, a current sense device, a voltage sense amplifier, a reference device, a temperature sense device, and a current control device. In one embodiment, the current control device receives a first signal based on the sensed load current, a second signal based on the sensed load voltage, a third signal based on the circuit temperature, and a reference signal. A lesser of the second, third, and reference signals is selected and differentially combined with the first signal. A control signal is derived from the combination to control a regulation of the load current. In a further embodiment, an external signal may be provided to the current control device for stabilization with respect to an external parameter.

25 Claims, 3 Drawing Sheets

CURRENT REGULATION CIRCUIT

FIELD OF THE INVENTION

The present invention relates to current regulation, and, in particular, to a current regulation circuit that provides a regulated output current that is substantially stabilized with respect to a load voltage, a load current, and a circuit temperature.

BACKGROUND

Certain electronic devices require regulated inputs, either regulated voltage or regulated current, to ensure they are stable and provide proper operation. Current regulators are often employed to provide a desired, regulated current to such devices including portable devices, cellular phones, battery chargers, and the like. For example, switching or linear regulators are often used to provide suitable power.

In applications in which a power supply provides a current to drive a load, it is desirable to control the amount of provided current at various cycles of operation to protect a load and optimize efficiency. Current regulators generally include a power pass device for regulating the current from a power source with a feedback mechanism. Commonly, the feedback is provided after the power pass device following the current regulation.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is related to a current regulation circuit that provides a regulated output current with limited maximum output voltage and maximum internal power dissipation. The present invention is further aimed at providing a stable output current to a load by controlling conditions in the regulator circuit such as voltage, current, temperature, and the like, and addresses instability in conventional current regulators due to overshoot and oscillation at switch-over point between a constant current mode and a constant voltage mode. The oscillation may also be caused by over-temperature of the charging circuit. According to the invention, a load current and a load voltage may be sensed and amplified to provide a first and a second input signal to a current control device. A temperature sense device may provide a third input signal, and a reference device a fourth input signal. The current control device may be arranged to select a minimum of the last three input signals and combine it with the first input signal. Then the current control device may provide a control signal to a power pass device based on the combination. Providing a feedback based on the load voltage and the temperature to an input of the current control device, as opposed to a providing a similar feedback at a later stage, enables the circuit to substantially stabilize the regulated load current. While a preferred embodiment of the present invention may be implemented as a core in a battery charging circuit, the invention is not so limited. For example, the described circuit may be employed as a general-purpose current source. Thus, the current regulator circuit may be implemented in virtually any regulation circuit known to those skilled in the art.

Figure 1:
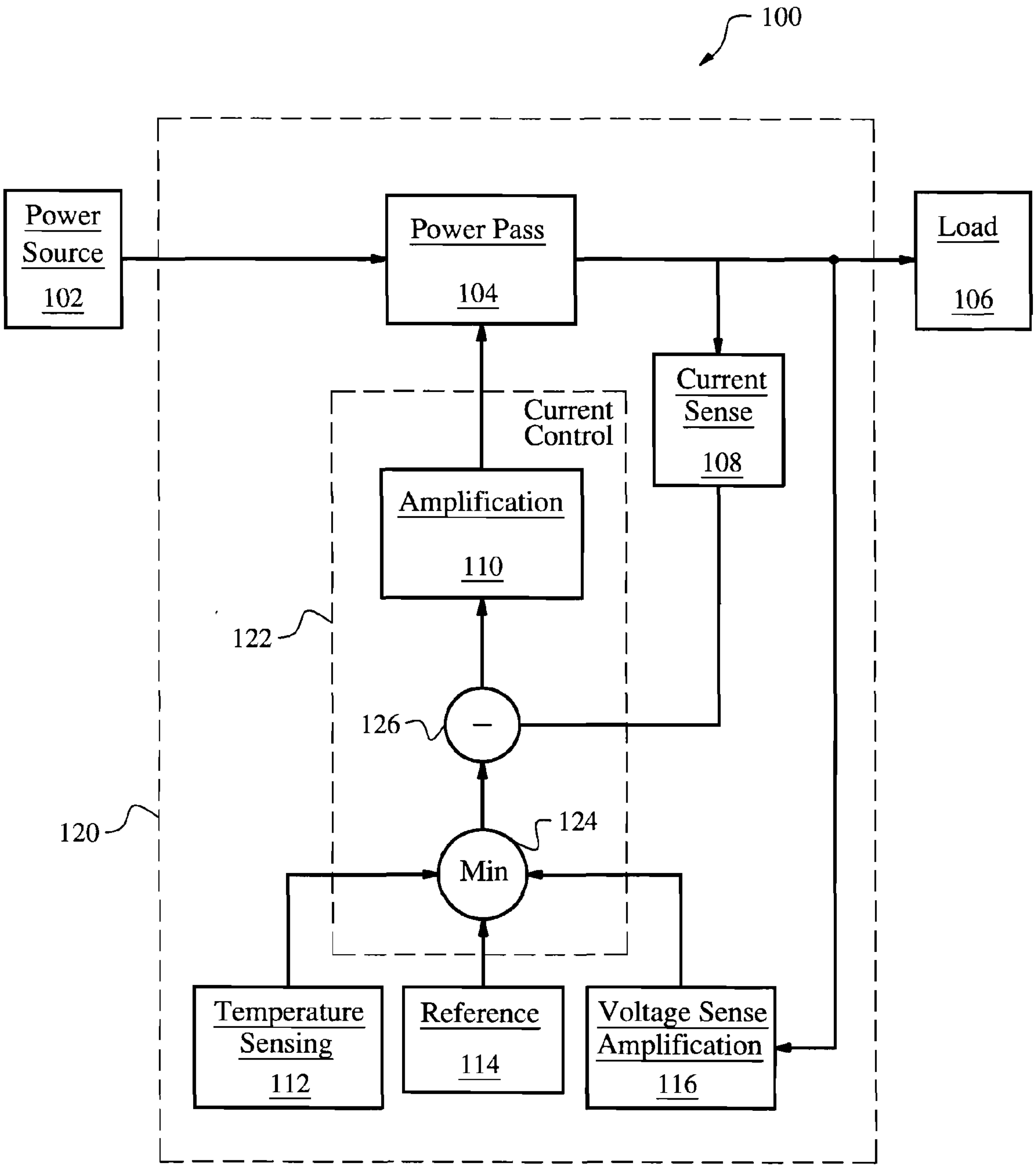
FIG. 1 illustrates a functional block diagram of an embodiment of a current regulation circuit according to one embodiment of the present invention.

FIG. 1 illustrates functional block diagram 100 of an embodiment of a current regulation circuit according to one embodiment of the present invention with external devices employing the circuit. External devices include power source 102 and load 106. Functional diagram of circuit 120 includes several function blocks: power pass 104, current sense 108, temperature sense 112, reference 114, voltage sense amplification 116, and current control 122. Current control 122 comprises minority selection function 124, differential combination function 126, and amplification 110. FIG. 1 shows a particular arrangement of inputs and outputs of the various components. In one embodiment, all of the components of circuit 120 are included in the same chip. Alternatively, one or more of the components of circuit 120 may be off-chip.

Power pass 104 may perform a function of receiving an input voltage from an external power source such as power source 102 and providing a regulated current to load 106. In one embodiment power source 102, load 106, or both may be implemented on a chip with circuit 120. Current sense 108 may be performed on the regulated current provided to load 106. The regulated current may be sensed and a current sense signal provided to combination function 126 of current control 122. Voltage sense amplification 116 may sense a load voltage based on the regulated current provided to load 106. Voltage sense amplification 116 may amplify the sensed load voltage and provide a first signal to minority selection function 124 of current control 122. Temperature sensing 112 may provide a second signal to minority selection function 124 of current control 122. Temperature sensing 112 may be implemented as any device, known to those skilled in the art, that may detect a temperature of circuit 120 and provide a signal based on the temperature. In one embodiment, the second signal may decrease when the temperature of circuit 120 increases. Reference 114 may provide a third signal to minority selection function 124 of current control 122. Reference 114 may be implemented as an external reference voltage source, an internal reference voltage source, and the like.

Current control 122 may be arranged to include minority selection function 124, differential combination function 126, and amplification 110. Current control 122 may provide a control signal to power pass 104 based on the current sense, first, second, and third signals and enable a substantial stabilization of the load current with respect to load current, load voltage, and circuit temperature. Minority selection function 124 may be arranged to determine a minimum signal based on the first, second, and third signals received from voltage sense amplification 116, temperature sensing 112, and reference 114. The minimum signal may then be differentially combined with the current sense signal from current sense 108 at differential combination function 126. Differential combination function 126 may provide the resulting signal to amplification 110. Amplification 110 may amplify the differentially combined signal and provide the control signal to power pass 104.

In addition to the load voltage, load current, and the temperature of the circuit, an external signal may be provided to the minority selection function in one embodiment. Such external signal may be based, in part, on a load temperature, a power source temperature, an elapsed charging time, and the like.

Figure 2:
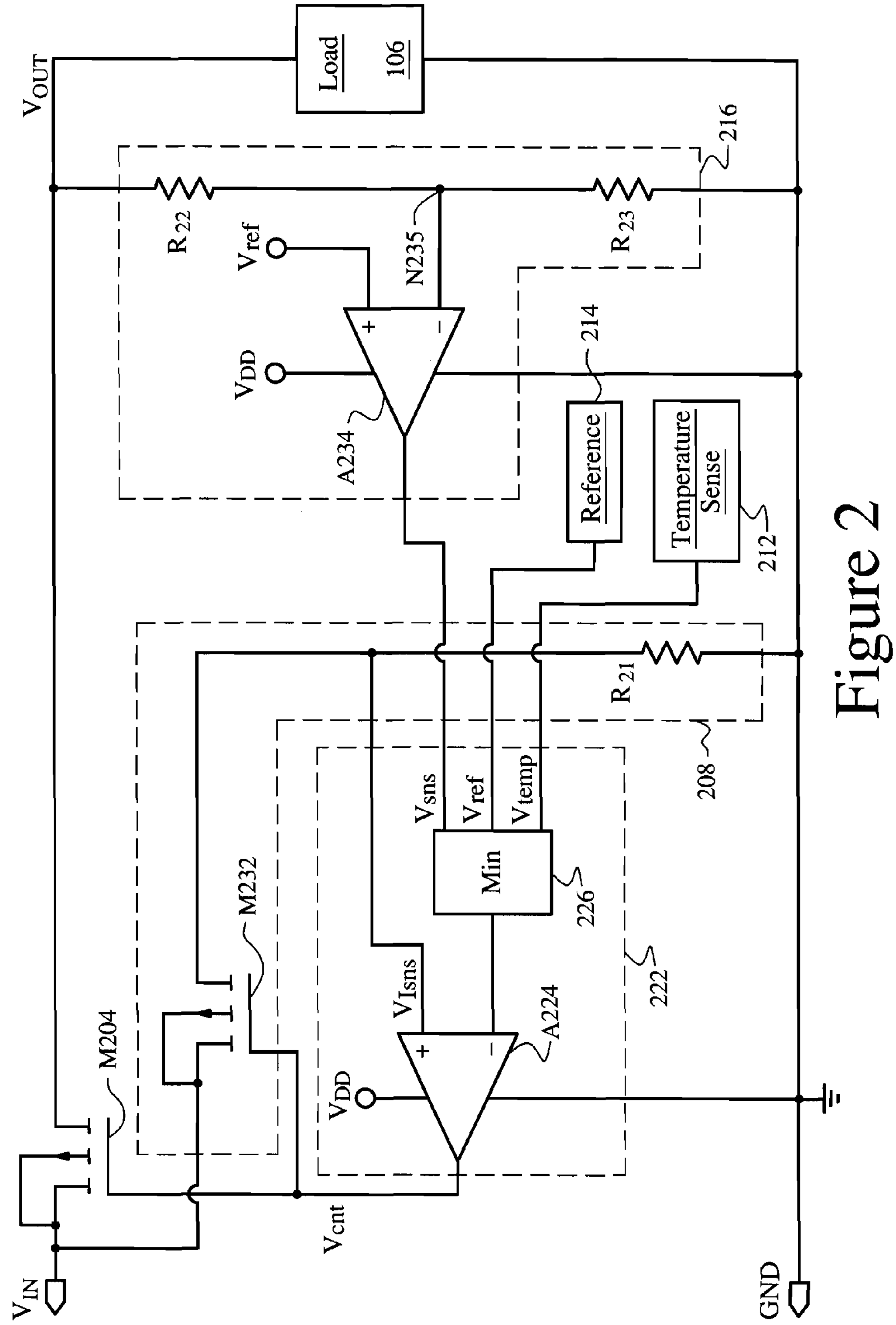
FIG. 2 schematically illustrates an embodiment of the current regulation circuit of FIG. 1.

FIG. 2 schematically illustrates an embodiment of a current regulation circuit. Circuit 220 may be an exemplary embodiment of the function blocks of circuit 120 of FIG. 1. Circuit 220 includes power transistor M204, current control device 222, current sense device 208, reference device 214, temperature sense device 212, and voltage sense amplification device 216. FIG. 2 also illustrates load 106, which is external to circuit 220.

Power transistor M204 is arranged to provide a regulated output current in response to input voltage $V_{IN}$ and a control signal $V_{cnt}$. The input voltage is provided to a source of power transistor M204. The control signal $V_{cnt}$ is provided to a gate of power transistor M204 from an output of current control device 222.

Current control device 222 may perform the functions of current control 122 of FIG. 1. Current control 222 includes minority selection device 226 and differential amplifier A224. Minority selection device 226 is arranged to receive a sense voltage $V_{sns}$ from voltage sense amplification device 216, a reference voltage $V_{ref}$ from reference device 214, and a temperature sense voltage $V_{temp}$ from temperature sense device 212. Minority selection device 226 may be arranged such that the lesser of $V_{sns}$, $V_{ref}$, and $V_{temp}$ is selected and an output voltage associated with the selected input voltage is provided to an input of differential amplifier A224. Another input of differential amplifier A224 is arranged to receive a current sense voltage $V_{Isns}$ from current sense device 208. Differential amplifier A224 provides control signal $V_{cnt}$ to the gate of power transistor M204 in response to a differential combination of the input signals, substantially stabilizing the regulated output current.

Current sense device 208 includes transistor M232 and resistor $R_{21}$. A gate and a source of transistor M232 is coupled to a gate and source of power transistor M204. A drain of transistor M232 is coupled to an input of differential amplifier A224 and to resistor $R_{21}$, which is coupled to ground at its other terminal. By sharing a source and gate voltage power transistor M204 and transistor M232 essentially form a current mirror. A current sense ratio of the circuit may be determined by a ratio of gate areas (width/length) between power transistor M204 and transistor M232. In one embodiment, power transistor M204 and transistor M232 may be selected such that the ratio of their gate areas is between about 500 and about 5000. A selection in this range may minimize sensing current and increase an efficiency of the circuit with respect to the load current.

Voltage sense amplification device 216 is arranged to sense an output voltage provided to load 106 and to provide $V_{sns}$ based on an amplification of the sensed output voltage. Voltage sense amplification device 216 may include a voltage divider that comprises resistors $R_{22}$ and $R_{23}$ serially coupled between a drain of power transistor M204 and a ground. Voltage sense amplification device 216 may further include amplifier A234, one input of which is coupled to node N235 between $R_{22}$ and $R_{23}$. The reference voltage $V_{ref}$ may be provided to another input of amplifier A234. In one embodiment, amplifier A234 may be implemented as a differential amplifier.

Temperature sense device 212 is arranged to detect a temperature of circuit 220 and to provide $V_{temp}$ based on the temperature. In one embodiment, $V_{temp}$ may decrease when the temperature of circuit 220 increases. Reference device 214 may provide $V_{ref}$ to amplifier 244. Reference device 214 may be implemented as an external reference voltage source, an internal reference voltage source, and the like.

In an exemplary operation, the output voltage and the temperature of the circuit may be below their respective, predetermined limits before the circuit is turned on. When the circuit is first turned on, a current flowing through power transistor M204 may be about zero. Because transistor M232 shares a common gate voltage with power transistor M204, a current flowing through transistor M232 will also be about zero. Consequently, there will not be a current flowing through resistor $R_{21}$ resulting in a voltage difference between differential amplifier A224's inputs. This voltage differential, in turn, may result in a change of the output voltage of differential amplifier A224, which provides the gate voltages to power transistor M204 and transistor M232. An increase in the gate voltages of power transistor M204 and transistor M232 may lead to an increased conductivity of the transistors and an increased current flow to load 106 as well as through resistor $R_{21}$. Increased current through resistor $R_{21}$ may lead to an increase of the voltage $V_{Isns}$ at the input of differential amplifier A224 such that the circuit may reach a balanced operation condition when the load current may be expressed by:

$$I_{load} = K * \frac{V_{ref}}{R_{21}},$$

where K is a ratio of gate area width/length of power transistor M204 and transistor M232.

In one embodiment, $V_{sns}$ may decrease as the load voltage approaches a predetermined limit, and $V_{temp}$ may decrease as the temperature of the circuit increases. When the load voltage or the circuit temperature approach their respective limits, the value of $V_{sns}$ or $V_{temp}$ may drop below a predetermined reference voltage $V_{ref}$. In this condition, the load current may be regulated by:

$$I_{load} = K * \frac{\min(V_{ref}, V_{sns}, V_{temp})}{R_{21}},$$

where K is as described above.

If at least one of the load voltage and the circuit temperature exceeds its respective limit, corresponding voltage $V_{sns}$ or $V_{temp}$, may drop to about zero resulting in a drop of the output current of differential amplifier A224 dropping to about zero and power transistor M204 being turned off.

Figure 3:
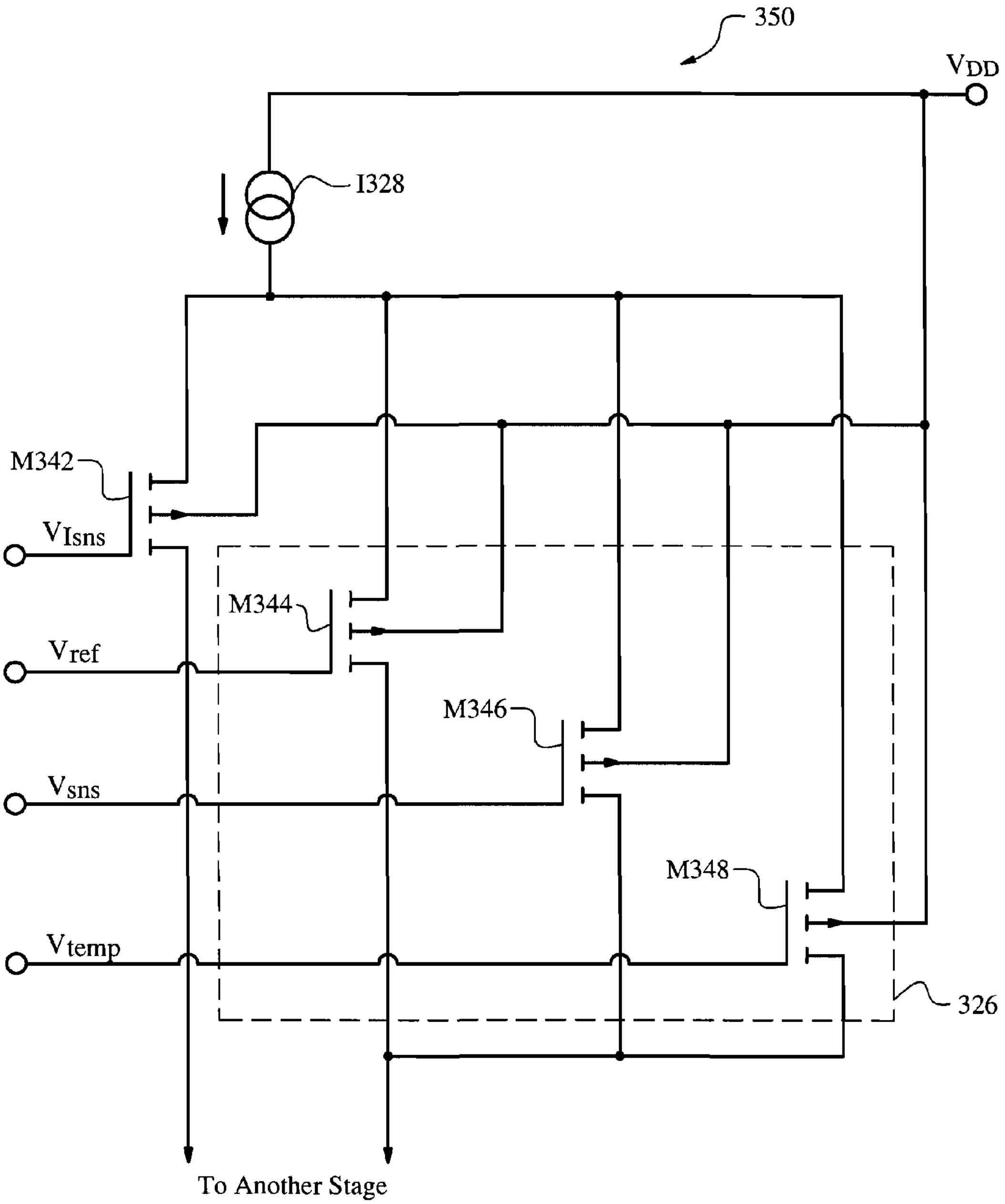
FIG. 3 schematically illustrates an embodiment of an input stage of an operational amplifier that may be employed in the current regulation circuit of FIG. 2.

FIG. 3 schematically illustrates an embodiment of input stage 350 of current control device 222 of FIG. 2 that may be employed in a current regulation circuit. Input stage 350 may be employed in an operational amplifier in one embodiment. Input stage 350 includes current source I328, transistor M342, and minority selection circuit 326.

Minority selection circuit 326 is arranged to receive three signals: $V_{sns}$, $V_{temp}$, and $V_{ref}$. Minority selection circuit 326 is further arranged to provide a first signal to another stage of an operational amplifier such as differential amplifier A224 based on a selection of the smallest value of $V_{sns}$, $V_{temp}$, and $V_{ref}$. Minority selection circuit 326 comprises transistors M344, M346, and M348. Sources of all three transistors are coupled to an output providing the selected minority signal as the first signal to the other stage. Drains of M344, M346, and M348 are coupled to current source I328. M344 is arranged to receive $V_{ref}$ at its gate. M346 is arranged to receive $V_{sns}$ at its gate. Finally, M348 is arranged to receive $V_{temp}$ at its gate.

As described in the example above, $V_{sns}$ and $V_{temp}$ may be arranged to decrease when the load voltage and the circuit temperature increase and approach $V_{ref}$ as the load voltage and the circuit temperature approach their respective predetermined limits. Transistors M344, M346, and M348 may comprise p-channel MOSFET type transistors. When both $V_{sns}$ and $V_{temp}$ are greater than about $V_{ref}$, transistor M344 conducts providing a path for a current from current source I328 to the output. In this case transistors M342 and M344 operate as a differential pair providing a combination of $V_{Isns}$ and $V_{ref}$ to the other stage.

If $V_{sns}$ drops below $V_{ref}$, while $V_{temp}$ is still above $V_{ref}$, M346 will begin to conduct and transistors M342 and M346 will act as differential pair providing a combination of $V_{Isns}$ and $V_{sns}$ to the next stage of operational amplifier A224. Similarly, if $V_{temp}$ drops below $V_{ref}$, while $V_{sns}$ is still above $V_{ref}$, transistor M348 will conduct and transistors M342 and M348 will act as differential pair providing a combination of $V_{Isns}$ and $V_{temp}$ to the following stage.

Transistor M342 is arranged to provide a second signal that is based on $V_{Isns}$ to the following stage for differential combination with the first signal. Transistor M342 is further arranged such that a source of the transistor provides an output for the following stage. A drain of transistor M342 is coupled to current source I328 along with other transistors in the circuit. A supply voltage $V_{DD}$ is provided to body terminals of all four transistors.

Current source I328 is arranged to provide current to transistors M342, M344, M346, and M348 in response to the supply voltage $V_{DD}$.

An order of transistors M344, M346, and M348 is not significant for the operation of the circuit. The transistors may be laid out in a different order and still perform their intended function.

The above specification, examples and data provide a description of the manufacture and use of the composition of the invention. Since many embodiments of the invention can be made without departing from the spirit and scope of the invention, the invention also resides in the claims hereinafter appended.

We claim:

1. A circuit for providing a regulated current to a load, comprising:

a power pass device that is arranged to receive an input voltage from a power source and to provide a regulated load current to the load in response to a control signal and the input voltage;

a current control device that is arranged to provide a minority signal that is selected from a current sense signal, a voltage sense signal, a temperature sense signal, and a reference signal, wherein the current control device is further arranged to provide the control signal to the power pass device in response to the minority signal such that the output current is maintained constant with respect to the load current, a load voltage, and an internal temperature of the circuit;

a minority selection device that is arranged to determine the minority signal based, in part, on the voltage sense signal, the temperature sense signal, and the reference signal; and a differential amplifier that is arranged to differentially combine the current sense signal and the minority signal, amplify the combination signal, and provide the control signal based on the combination.

2. The circuit of claim 1, further comprising a current sense device that is arranged to sense the load current and provide the current sense signal to the current control device in response to the load current.

3. The circuit of claim 1, further comprising a voltage sense amplification device that is arranged to sense the load voltage and provide the voltage sense signal to the current control device in response to the load voltage.

4. The circuit of claim 1, further comprising a temperature sensing device that is arranged to sense the internal temperature of the circuit and provide the temperature sense signal to the current control device in response to the internal temperature.

5. The circuit of claim 1, further comprising a reference device that is arranged to provide the reference signal to the current control device.

6. The circuit of claim 1, wherein the power pass device comprises a power transistor that is arranged to receive the input voltage and to provide the regulated load current to the load in response to the control signal.

7. The circuit of claim 1, wherein the voltage sense amplification device comprises an amplifier and a voltage divider.

8. The circuit of claim 7, wherein the reference signal is provided to an input of the amplifier, and a portion of the load voltage is provided to another input of the amplifier.

9. The circuit of claim 1, wherein the current sense device comprises a transistor and a resistor, wherein the transistor acts as a current mirror with a power transistor of the power pass device.

10. The circuit of claim 2, wherein the current sense device is arranged to sense and input current of the power source.

11. The circuit of claim 1, wherein the current control device is further arranged to receive an external signal.

12. The circuit of claim 11, wherein the external signal comprises a signal indicating at least one of a power source status and a load status.

13. The circuit of claim 1, wherein the power source comprises at least one of a AC/DC adapter, a DC/DC adapter, a Power-over-Ethernet source, and a USB port.

14. The circuit of claim 1, wherein the load comprises at least one of a cellular phone, a personal digital assistant, a laptop computer, and a handheld data collection device.

15. A circuit for providing a regulated current to a load, comprising:

a power pass device that is coupled to a power source and a load;

a current control device that is coupled to the power pass device and that includes an amplification device and a minority selection device, wherein the minority selection device is coupled to the amplification device;

a voltage sense amplification device that is coupled to the load and to the minority selection device;

a temperature sense device that is coupled to the minority selection device;

a reference device that is coupled to the minority selection device;

a current sense device that is coupled to the load and to the amplification device, wherein the minority selection device is arranged to determine a minority signal based, in part, on a voltage sense signal, a temperature sense signal, and a reference signal, and wherein the amplification device is arranged to differentially combine a current sense signal and the minority signal, amplify the combination signal, and provide a control signal based on the combination for regulating the current to the load.

16. The circuit of claim 15, wherein the power pass device comprises a power transistor such that a source of the transistor is coupled to the power source, a drain of the transistor is coupled to the load, and a gate of the transistor is coupled to an output of the current control device.

17. The circuit of claim 15, wherein the current sense device comprises a transistor and a resistor such that a source of the transistor is coupled to the power source, a gate of the transistor is coupled to an output of the current control device, and a drain of the transistor is coupled to a ground through the resistor.

18. The circuit of claim 15, wherein the voltage sense amplification device comprises an amplifier and a voltage divider such that the voltage divider comprises of a first resistor coupled to the load and the second resistor at a node, the second resistor further coupled to a ground, and the node coupled to an input of the amplifier.

19. The circuit of claim 15, wherein the current control device includes the minority selection device and a differential amplifier such that:

outputs of the voltage sense amplification device, the reference device, and the temperature sense device are coupled to an input of the minority selection device; and outputs of the minority selection device and the current sense device are coupled to an input of the differential amplifier.

20. The circuit of claim 19, wherein an input stage of the current control device comprises:

a first transistor, wherein a gate of the transistor is coupled to an output of the current sense device, a source of the transistor is coupled to an output of a current source, and a drain of the transistor if coupled to an output of the input stage;

a second transistor, wherein a gate of the transistor is coupled to an output of the reference device, a source of the transistor is coupled to the output of the current source, and a drain of the transistor if coupled to another output of the input stage;

a third transistor, wherein a gate of the transistor is coupled to an output of the voltage sense amplification device, a source of the transistor is coupled to the output of the current source, and a drain of the transistor if coupled to the other output of the input stage; and a fourth transistor, wherein a gate of the transistor is coupled to an output of the temperature sense device, a source of the transistor is coupled to the output of the current source, and a drain of the transistor if coupled to the other output of the input stage.

21. The circuit of claim 20, wherein the second, the third, and the fourth transistors are arranged to provide a minimum signal based on the outputs of the reference device, the voltage sense amplification device, and the temperature sense device.

22. The circuit of claim 20, wherein a second stage of the current control device is arranged to provide a differential combination of an output of the first transistor and the minimum signal to an input of the power pass device.

23. A method for providing a regulated signal to a load, comprising:

receiving an input signal from a power source;

providing the regulated signal to the load in response to a control signal and the input signal;

providing the control signal, wherein the control signal is determined by:

providing a first signal based on sensing a load current;

providing a second signal based on sensing a load voltage;

providing a third signal based on an internal temperature of a circuit;

providing a reference signal;

determining a minority signal based on the second, the third, and the reference signal; and differentially combining the first signal and the minority signal; and controlling the regulated signal based on the control signal.

24. A circuit for providing a regulated current to a load, comprising:

a means for regulating an input signal to provide a regulated output signal;

a means for sensing an output current;

a means for providing a current sense signal based on the sensed output current;

a means for sensing an output voltage across the load;

a means for providing a voltage sense signal based on the sensed output voltage;

a means for providing a temperature sense signal based on an internal temperature of the circuit;

a means for providing a reference signal;

a means for determining a minority signal based on the voltage sense signal, the temperature sense signal, and the reference signal;

a means for combining the current sense signal and the minority signal to provide a control signal; and a means for controlling the regulated output signal based, in part, on the control signal.

25. A circuit for providing a regulated current to a load, comprising:

a power pass device that is arranged to receive an input voltage from a power source and to provide a regulated load current to the load in response to a control signal and the input voltage; and a current control device that is arranged to provide the control signal based on input signals which include a minority signal, the input signal that is selected from a current sense signal, a load voltage sense signal, a temperature sense signal, and a reference signal, wherein the current control device is further arranged to provide the control signal to the power pass device in response to determining the minority signal based, in part, on at least one of the load voltage sense signal, temperature sense signal, and reference signal and combining the determined minority signal with the current sense signal, such that the output current is maintained constant with respect to at least two of the load current, a load voltage, a load temperature, a power source temperature, an elapsed charging time, and an internal temperature of the circuit.

* * * * *